US011485239B2

(12) United States Patent
Wang et al.

(10) Patent No.: US 11,485,239 B2
(45) Date of Patent: Nov. 1, 2022

(54) POWER PREDICTION FOR RECONFIGURABLE SERIES-CONNECTED BATTERY WITH MIXED BATTERY CHEMISTRY

(71) Applicant: GM GLOBAL TECHNOLOGY OPERATIONS LLC, Detroit, MI (US)

(72) Inventors: Yue-Yun Wang, Troy, MI (US); Garrett M. Seeman, Novi, MI (US); Jeffrey S. Piasecki, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 764 days.

(21) Appl. No.: 16/429,814

(22) Filed: Jun. 3, 2019

(65) Prior Publication Data
US 2020/0376968 A1 Dec. 3, 2020

(51) Int. Cl.
| | |
|---|---|
| *B60L 50/60* | (2019.01) |
| *B60L 50/51* | (2019.01) |
| *G01R 31/3835* | (2019.01) |
| *B60L 53/60* | (2019.01) |
| *B60L 58/12* | (2019.01) |
| *G01R 31/367* | (2019.01) |

(52) U.S. Cl.
CPC ............... *B60L 50/66* (2019.02); *B60L 50/51* (2019.02); *B60L 53/60* (2019.02); *B60L 58/12* (2019.02); *G01R 31/367* (2019.01); *G01R 31/3835* (2019.01); *B60L 2240/427* (2013.01); *B60L 2260/44* (2013.01)

(58) Field of Classification Search
CPC ... G01R 31/367; G01R 19/16542; B60L 3/12; B60L 2260/44; B60L 2240/547; B60L 50/51; B60L 53/11; B60L 58/12; B60L 50/66; B60L 53/60; Y02T 10/7072; Y02T 90/14
See application file for complete search history.

(56) References Cited

U.S. PATENT DOCUMENTS

| | | | |
|---|---|---|---|
| 2020/0070667 A1* | 3/2020 | Wang | B60L 58/19 |
| 2020/0235440 A1* | 7/2020 | Hao | H01M 10/425 |
| 2020/0376968 A1* | 12/2020 | Wang | B60L 53/60 |

* cited by examiner

*Primary Examiner* — Jared Fureman
*Assistant Examiner* — Duc M Pham
(74) *Attorney, Agent, or Firm* — Quinn IP Law

(57) ABSTRACT

Powerflow of a rechargeable energy storage system (RESS) is managed according to a method. The RESS has series-connected first and second battery elements with different characteristics. Each element, e.g., a pack, has a corresponding maximum or minimum voltage or current limit. Currents are predicted for each of the first and second battery elements via a controller using a corresponding voltage limit. A requested operating mode of the RESS is used to select a current for the elements. A voltage across the elements is predicted using the selected current and a corresponding battery state space model. The method predicts a total power capability of the RESS over a prediction horizon using the selected current to generate predicted power capability values. The requested operating mode is controlled over the horizon using the power capability values. A powertrain system includes the RESS, an inverter, an electric machine, and the controller.

20 Claims, 7 Drawing Sheets

POWER PREDICTION FOR RECONFIGURABLE SERIES-CONNECTED BATTERY WITH MIXED BATTERY CHEMISTRY

INTRODUCTION

A rechargeable energy storage system (RESS) is a core component of a high-voltage electrical system. When the RESS is configured as an electric battery having multiple battery cells, the constituent battery cells are collectively operable for storing or releasing electrochemical energy as needed during a given operating mode. For instance, stored electrical energy may be used to energize the phase windings of an electric machine or power another electrical load during a discharging mode, e.g., a drive mode when the RESS is used as part of an electrified powertrain. The battery cells may be selectively recharged using an offboard charging station in certain RESS configurations, with the charging process possibly expedited using a direct current fast-charging process. A battery controller may be used to monitor the ongoing performance of the RESS, as well as to manage the flow of electrical energy to and from the individual battery cells.

SUMMARY

The present disclosure relates to improved methods for managing powerflow of an RESS having two or more battery packs or other battery elements in which the packs or battery elements thereof are connected in electrical series. The total power capability of the RESS is predicted over a prediction horizon, for instance 0.1 seconds (s), 1s, 2s, 10s, and 20s into the future.

In an embodiment, the RESS includes two or more S-connected battery elements. The battery elements may be selectively connected to an offboard DC fast-charging station during a charging mode of operation.

The controller, which may be embodied as a unitary controller or as multiple controllers, e.g., two or more vehicle integration control modules (VICMs) arranged in a server/client relationship or other hierarchical arrangement, is used to predict the total power capability of the RESS when the battery elements have different characteristics, possibly including but not limited to imbalanced states of charge, or different battery cell capacities, different cell chemistries, calibrated voltage and/or current limits, etc. The controller executes battery state-related logic to perform the present method, such that the controller predicts a corresponding pack current flowing through each battery element and estimates a voltage across each of the multiple battery elements. The controller then predicts the total power capability of the RESS and thereafter controls operation of the RESS using this predicted value.

An embodiment of a method for managing powerflow of the RESS includes predicting first and second currents for the first and second battery elements, respectively, via a controller using the corresponding voltage limit, and receiving, via the controller, a requested operating mode of the RESS. The method includes selecting the first or second current as a selected current based on the requested operating mode, predicting a voltage across each battery element using the selected current and corresponding battery state space models, and then predicting a total power capability of the RESS. The power capability prediction occurs over a predetermined prediction horizon using the selected current, and ultimately generates a plurality of predicted power capability values. The requested operating mode is then controlled over the predetermined prediction horizon, via the controller, using the predicted power capability values.

Selecting the first or second current may include selecting a minimum of the first or second current when the requested operating mode is a charging mode, or it may include selecting a maximum of the first or second current when the requested operating mode is a discharging mode.

The method may include receiving a fast-charging voltage and current from an offboard fast-charging station, via the RESS, during a fast-charging operation. The requested operating mode in such an instance is the charging mode, and controlling the requested operating mode occurs during such a charging mode by controlling the fast-charging operation via the controller.

The requested operating mode may be the discharging mode, with controlling the requested operating mode including energizing a rotary electric machine via the RESS and a power inverter module.

The predetermined prediction horizon may include at least five future time points relative to a present time point (k=0), including k=0.1 s, 1 s, 2 s, 10 s, and 20 s.

The controller may include hierarchically-arranged first and second controllers. In such a hierarchy, predicting the second current may be accomplished via the second controller using a second one of the battery state space models and communicated to the first controller, predicting the first current may be accomplished via the first controller using a first of the battery state space models, and predicting the total power capability and controlling the requested operating mode may be accomplished via the first controller.

The first and second controllers may be first and second vehicle integration control modules (VICMs) of a motor vehicle.

Each of the battery state space models includes a plurality of battery parameters for the first and second battery elements, respectively, including a state of charge, an open-circuit voltage, and a battery impedance in a non-limiting embodiment.

The RESS may include a third battery element that is serially-connected to the first and second battery elements. In such a configuration, the first, second, and third battery elements may each have a corresponding controller and a corresponding battery state space model.

A powertrain system may include a power inverter module (PIM) connected to the RESS, a rotary electric machine connected to the PIM and having an output member coupled to a load, and a controller operable for managing powerflow of the RESS via the present method.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present disclosure when taken in connection with the accompanying drawings and the appended claims.

Figure 1:
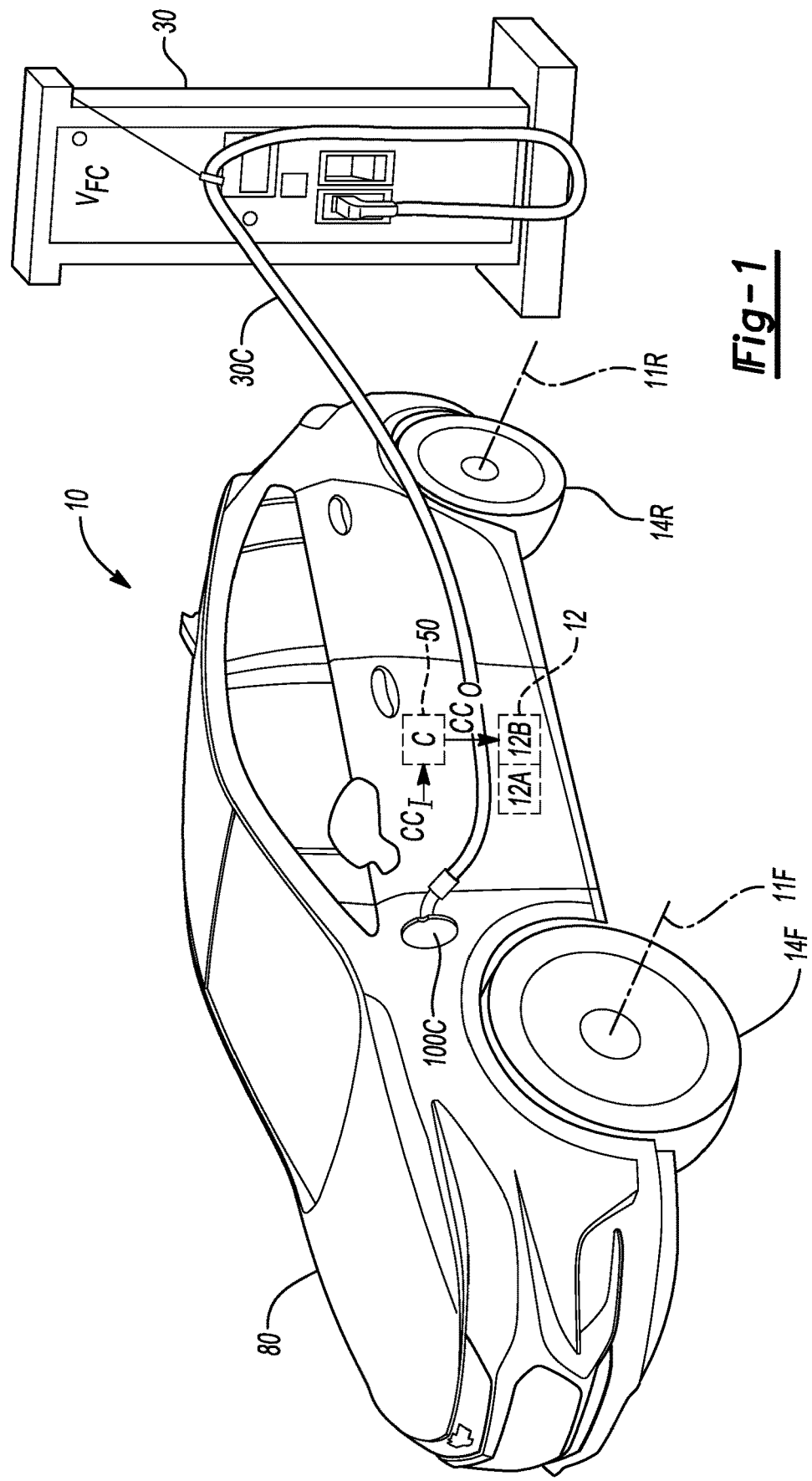
FIG. 1 is a schematic illustration of an example motor vehicle undergoing a DC fast-charging operation, with the motor vehicle having a rechargeable energy storage system ("RESS") that is possibly constructed from multiple serial-connected or parallel-connected battery packs having serially-connected battery elements, e.g., cells, modules, or sections, the power capability of which is estimated in real-time over a forward-looking time horizon and applied by a resident battery controller during charging and discharging modes of operation as described herein.

The present disclosure is susceptible to modifications and alternative forms, with representative embodiments shown by way of example in the drawings and described in detail below. Inventive aspects of this disclosure are not limited to the disclosed embodiments. Rather, the present disclosure is intended to cover modifications, equivalents, combinations, and alternatives falling within the scope of the disclosure as defined by the appended claims.

DETAILED DESCRIPTION

Referring to the drawings, wherein like reference numbers refer to the same or like components in the several Figures, a motor vehicle 10 is depicted in FIG. 1 as an example electrified system having a rechargeable energy storage system ("RESS") 12. The RESS 12 may have two or more battery packs, which are schematically depicted in FIG. 1 as representative first and second battery packs 12A and 12B, respectively. The first and second battery packs 12A and 12B may be serially-connected ("S-connected") as shown in FIGS. 2-5 and 9, or they may be parallel-connected ("P-connected") as represented in FIG. 10.

In either configuration, battery elements of the first and second battery packs 12A and 12B are S-connected, with such battery elements possibly being the packs themselves or the individual battery cells, cell modules, or pack sections forming the respective first and second battery packs 12A and 12B. Each of the first and second battery packs 12A and 12B may have a maximum voltage/energy capability of 370-400V/60 kWh in a non-limiting example high-voltage embodiment. Such an embodiment may be beneficial for applications in which the RESS 12 is chargeable via a high-voltage charging station, and/or to power high-voltage traction and/or power generation functions aboard the motor vehicle 10, or to power another load when the motor vehicle 10 is embodied as a marine vessel, aircraft, watercraft, rail vehicle, powerplant, etc., such as propellers or a drive shaft. For illustrative consistency, the motor vehicle 10 will be described hereinafter as an example application of the present teachings without limiting such applications to the depicted embodiment.

A controller (C) 50 embodied as an onboard/resident electronic control unit receives input signals (arrow $CC_I$), is used to manage powerflow to and from the RESS 12 using a set of output signals (arrow $CC_O$). Although omitted for illustrative clarity from FIG. 1, the controller 50, responsive to a threshold imbalance in a state of charge of the first and second battery packs 12A and 12B, may be configured to command automatically balancing of the state of charge using open/closed state control of a cell balancing circuit (not shown), as will be appreciated by those of ordinary skill in the art. The controller 50 is also configured to execute the present method 100 of FIG. 6 using the example control logic 50L, 150L, 50L*, and 150L* of FIGS. 7 and 8, doing so using one of the disclosed controller configurations of FIG. 2-4 or 9.

The example motor vehicle 10 includes front and rear drive wheels 14F and 14R, respectively, which rotate about a respective front and rear drive axis 11F and 11R. The motor vehicle 10 may be variously embodied as a plug-in electric vehicle having the RESS 12, e.g., a multi-cell lithium ion, zinc-air, nickel-metal hydride, or lead acid type battery system, that can be selectively recharged via a DC fast-charging voltage ($V_{FC}$) from an off-board DC fast-charging station 30. During such an operation, the RESS 12 is electrically connected to the off-board DC fast-charging station 30 via a charging port 100C located at an accessible part of a body 80 of the motor vehicle 10. The charging port 100C is connected to a DC charge connector (not shown) disposed at the end of a length of charging cable 30C. Such a connector may be embodied as an SAE J1772, a CHAdeMO charge connector, or another suitable regional or national standard charging plug or connector. However, the present teachings are independent of the charging standard ultimately employed in a DC fast-charging operation involving the DC fast-charging station 30, and therefore the above-noted examples are merely illustrative of the present teachings.

Figure 2:
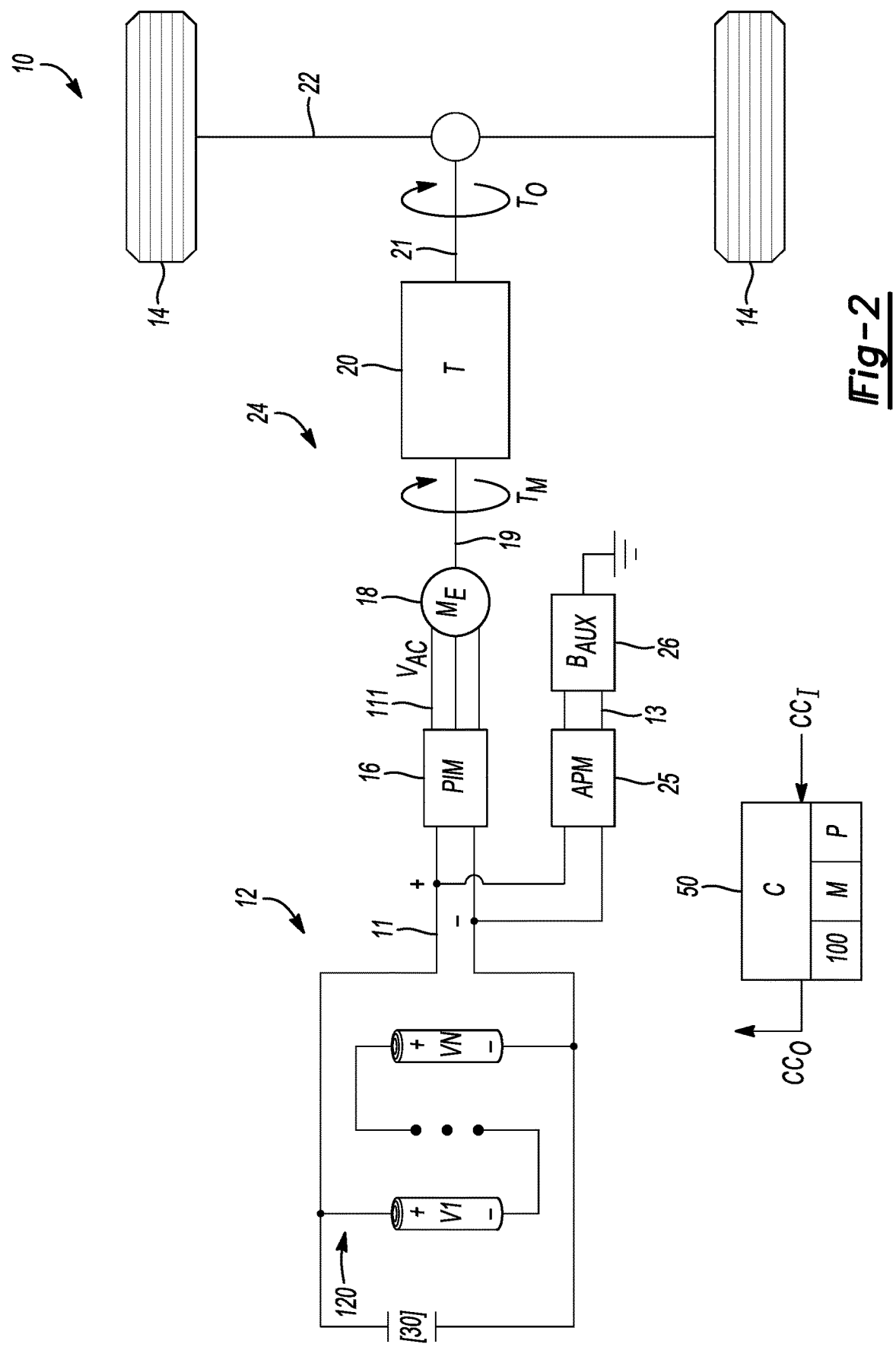
FIG. 2 is a schematic illustration of a motor vehicle having an exemplary dual-pack RESS and an associated battery controller.

Referring to FIG. 2, the motor vehicle 10 includes an electrified powertrain system 24 having the above-described RESS 12, a power inverter module (PIM) 16, a rotary electric machine (ME) 18, and a transmission (T) 20. The powertrain system 24 includes a DC voltage bus 11 and an AC voltage bus 111 ($V_{AC}$), with the PIM 16 operable for inverting a DC voltage on the DC voltage bus 11 to an AC voltage on the AC voltage bus 111 and vice versa as needed, e.g., in response to pulse width modulation signals as will be appreciated by those of ordinary skill in the art. To that end, upper and lower switches (not shown) internal to the PIM 16, e.g., IGBTs or MOSFETs, have binary on/off switching states that are controlled in real time to generate a desired output voltage from the PIM 16.

Additional components may be connected to the DC voltage bus 11, with one such component being an auxiliary power module (APM) 25, i.e., a DC-DC voltage converter. A low-voltage/auxiliary battery ($B_{AUX}$) 26 may be connected to the APM 25 via another DC voltage bus 13, with the DC voltage bus 13 having a potential of 12-15V or 48V in different embodiments. The AC voltage bus 111 is connected to individual phase windings of the electric machine 18, with a three-phase embodiment of the electric machine 18 depicted in FIG. 2. The energized electric machine 18 delivers motor torque (arrow $T_M$) to an input member 19 of the transmission 20. Output torque (arrow $T_O$) is ultimately transferred to an output member 21 of the transmission 20, and ultimately to drive wheels 14, e.g., the front and/or rear 14F and 14R shown in FIG. 1, via one or more drive axles 22.

With respect to operation of the RESS 12, power estimation of the RESS 12 is performed in real-time by the controller 50 using a processor (P) and memory (M). Control of the RESS 12 occurs via transmission of the above-noted battery control signals (arrow $CC_O$). The memory (M) includes tangible, non-transitory memory, e.g., read only memory, whether optical, magnetic, flash, or otherwise. The controller 50 also includes application-sufficient amounts of random-access memory, electrically-erasable programmable read only memory, and the like, as well as a high-speed clock, analog-to-digital and digital-to-analog circuitry, and input/output circuitry and devices, as well as appropriate signal conditioning and buffer circuitry.

Figure 3:
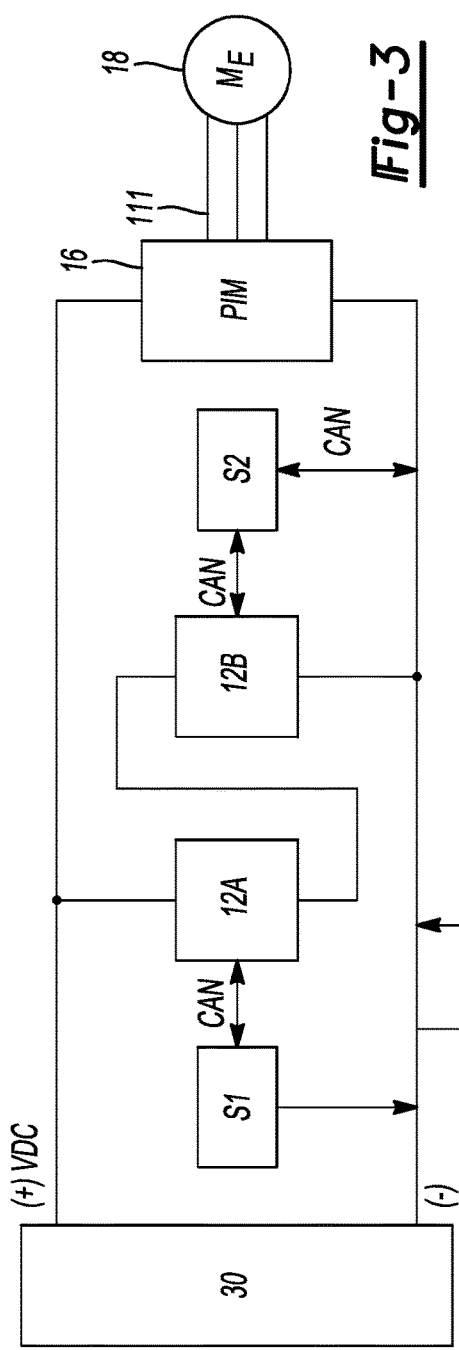
FIG. 3 is a schematic illustration of a controller configuration for use with the motor vehicle of FIG. 2.
Figure 6:
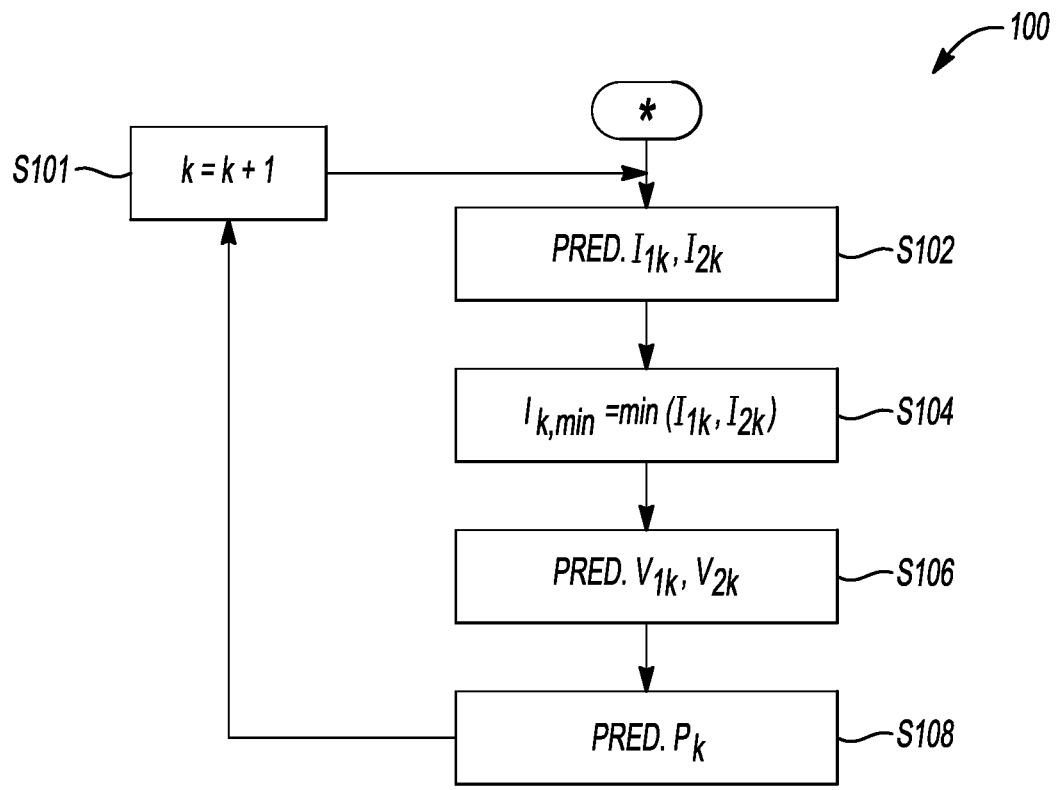
FIG. 6 is a flow chart describing an example method for estimating the total power capability of the RESS depicted in FIGS. 1-4.

The controller 50 is programmed to execute instructions embodying the present power estimation method 100, an example embodiment of which is shown in FIG. 6, with the controller 50 receiving the input signals (arrow $CC_I$) indicative of a driver-requested or autonomously-requested operating mode of the powertrain system 24, and including measured pack voltage, current, temperature, and/or other measured battery values from first and second pack sensors S1 and S2 of FIG. 3. In response, the controller 50 outputs the battery control signals (arrow $CC_O$) to the RESS 12 and the PIM 16, as needed, and also executes the method 100. In some instances, the input signals (arrow $CC_I$) may be received by the controller 50 during charging as part of ongoing communication between the controller 50 and the DC fast-charging station 30 of FIG. 1 upon connection of the motor vehicle 10 to the DC fast-charging station 30, such as when the station 30 communicates a maximum charging voltage to the controller 50 and during an active charging event of the RESS 12, or during ongoing drive operation of the motor vehicle 10.

In the non-limiting representative embodiment of FIG. 2, a serial battery circuit 120 includes multiple battery packs, shown as voltages V1, . . . , Vn, which may correspond to the first battery pack 12A and 12B of FIG. 1 up to n such battery packs. While the present teachings are described with respect to the battery packs 12A and 12B, those of ordinary skill in the art will appreciate that the identity of the voltages V1, . . . , Vn need not be a full pack, but may extend to battery elements constituting such a full pack as noted above. During a high-voltage fast-charging operation of the RESS 12 in which the RESS 12 is connected to the offboard fast-charging station 30 of FIG. 1, the controller 50 may determine the corresponding pack voltages V1, . . . , VN, e.g., via onboard measurement and/or calculation, as will be appreciated by those of ordinary skill in the art. The pack sensors S1 and S2 shown schematically in FIG. 3 may be used to measure such pack voltages, as well as corresponding pack currents and pack temperatures as noted above, all of which are communicated to the controller 50 as part of the input signals (arrow $CC_I$).

Although shown schematically for illustrative simplicity, the respective first and second battery packs 12A and 12B of FIG. 3 each have a corresponding serial string of battery cells, with the number of such battery cells being application-specific. For instance, ninety-six such battery cells may be used in an example embodiment, with a cell voltage for each battery cell being about 4.0V to 4.5V. Each battery cell may have a corresponding cell balancing circuit such that a given battery cell may be selectively bypassed to enable excess energy to be drained from the first or second battery pack 12A or 12B, whichever has the higher pack voltage.

FIG. 3 depicts a simplified control embodiment in which a single controller 50 performs the requisite power prediction calculations and control functions for two S-connected battery packs, i.e., the first and second battery packs 12A and 12B. Pack sensors S1 and S2 may be used to measure pack-specific parameters, e.g., currents, temperatures, and voltages. Such measurements may be reported to the controller 50 over a suitable communications medium and protocol, for instance a controller area network (CAN).

Figure 4:
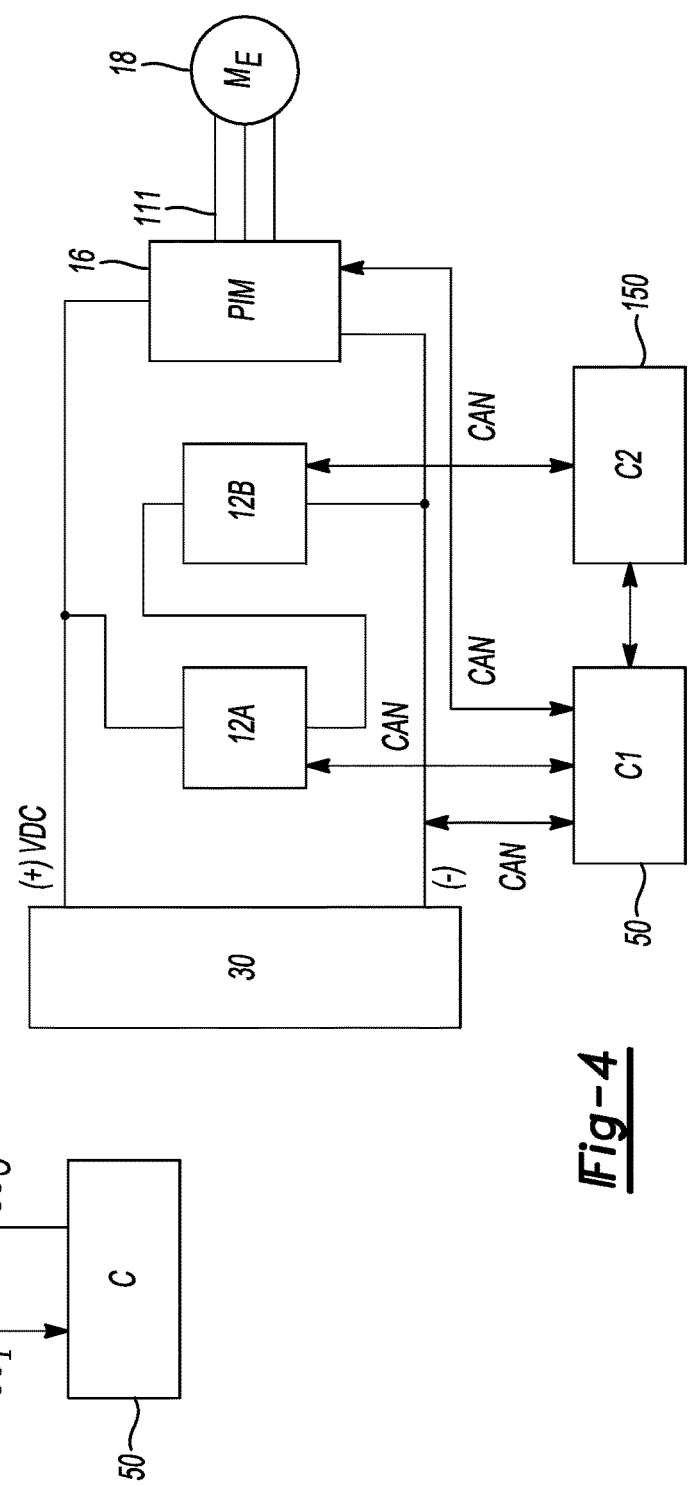
FIG. 4 is in which multiple controllers communicate in a hierarchical arrangement.

As an alternative to the embodiment of FIG. 3, a multi-controller topology shown in FIG. 4 may be used in which first and second controllers 50 (C1) and 150 (C2) for the simplified dual-pack implementation communicate with each other over the above-noted medium and protocol. The first controller 50 may act as the main controller or server in a server-client or other hierarchical arrangement in which the second controller 150 acts as a client device. With (n) controllers possibly used in such an embodiment (see FIG. 9), all but the first controller 50 may act as clients in the overall control function set forth herein. In such an embodiment, the first controller 50 may collect data from its pack sensors S1 (FIG. 3) describing operation of the first battery pack 12A, and may send and collect data to the second controller 150. The first controller 50 may also manage control of communication between the motor vehicle 10 and the fast-charging station 30 of FIG. 1.

The second controller 150 in such a hierarchical arrangement may collect data from its associated pack sensors S2 (FIG. 2) describing operation of the second battery pack 12B, receive data from and send data to the first controller 50, estimate performance of the second battery pack 12B, and then send the estimated performance of the second battery pack 12B to the first controller 50. In such a scheme, the first controller 50 acts as the main controller and thus functions as the battery system manager. As will be described below with reference to FIG. 9, the general approach shown in FIG. 4 may be extended to (n) battery packs with (n) controllers, such that (n) exceeds the two-pack embodiment of FIG. 3.

Figure 5:
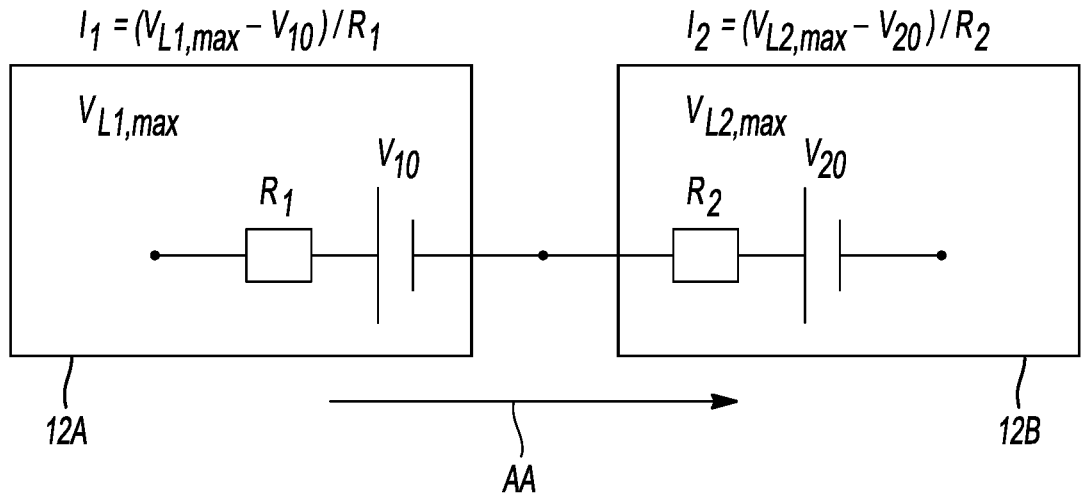
FIG. 5 is a schematic circuit diagram generally describing pack current estimation as part of the present method.

Referring to FIG. 5, power estimation, particularly in a new vehicle, would ordinarily typically assume that S-connected battery packs share a common battery chemistry and pack current, with the flow of current indicated by arrow AA. That is:

$$I_1 = \frac{(V_{L1,max} - V_{10})}{R_1}$$

$$I_2 = \frac{(V_{L2,max} - V_{20})}{R_2}$$

where $V_{10}$ and $V_{20}$ are the respective open-circuit voltages, and where each of the respective first and second battery packs 12A and 12B has a corresponding maximum voltage limit $V_{L1,max}$ and $V_{L2,max}$.

In a charging case where the state of charge of one battery pack is greater than the other, it is desirable to minimize the amount of charging current flowing through that particular battery pack in order to avoid excessively high voltage. As will be appreciated, the higher the terminal voltage of a given S-connected battery pack, the higher the pack current flowing through that particular battery pack, and vice versa. It follows that for each of the S-connected packs to meet their respective maximum voltage limits, one may determine the minimum pack current ($I_{min}$) as:

$$I_{min} = \min[I_1(V_{L1,max}), I_2(V_{L2,max})]$$

If at a given instant $I_{min}$ is $I_1$, for instance, the controller 50 could calculate the voltage-limited total power as:

$$P_T(t_i) = V_{L1,max} I_1(i) + V_{2T}(I_1) I_1(i)$$

where $V_{2T}$ is the predicted terminal voltage of the second battery pack 12B for the given current $I_1$ using a corresponding battery pack model as set forth herein.

However, a complication is introduced to such an approach when characteristics of S-connected battery packs (or S-connected elements thereof) begin to diverge from one another over time, e.g., due to different ages, repair histories, or other factors such as different chemistries. The present method 100 is therefore intended to solve this particular problem and thereby produce more accurate power estimates in the overall control of an RESS.

FIG. 6 depicts a flowchart describing the present method 100 for an example charging case to predict a maximum voltage-limited power capability of the RESS 12, which may be used in single controller or multi-controller configurations as shown in FIGS. 1-4 and 9 to estimate power capability of the RESS 12 under discharging and charging modes of operation. For simplicity, the controller 50 is described below as performing the various steps of the method 100 regardless of how many different controllers are actually used in a particular implementation. FIG. 6 is described with reference to FIG. 7 (charging mode) and FIG. 8 (discharging mode) as an exemplary illustration of the present teachings.

Beginning with step S101, the sample time (k) is incremented from an initial setting (k=0). The method 100 proceeds to step S102 when the sample time (k) has been incremented for the present iteration of method 100.

At step S102, using calibrated or predetermined maximum voltage limits for each of the first and second battery packs 12A and 12B, i.e., $V_{L1,max}$ and $V_{L2,max}$, the controller 50 predicts corresponding first and second pack currents $I_{1k}$ and $I_{2k}$ at sample time (k) for the respective first and second battery packs 12A and 12B ("PRED. $I_{1k}$, $I_{2k}$"). That is, a corresponding calibrated voltage limit ($V_{L1,max}$ and $V_{L2,max}$) exists for each of the series-connected first and second battery packs 12A and 12B, which may be information provided by a manufacturer of battery packs 12A and 12B. The method 100 then proceeds to step S104.

At step S104, the controller 50 selects one of the first and second pack currents from step S102 as a selected current based on a requested operating mode, i.e., charging or discharging, and sets a current limit for the first and second battery packs 12A and 12B as the selected current. In the illustrated charging mode example, this is the minimum of the various voltage-limited predicted packs currents from step S102, i.e.,: $I_{k,min} = \min(I_{1k}, I_{2k})$. The method 100 then proceeds to step S106.

Figure 7:
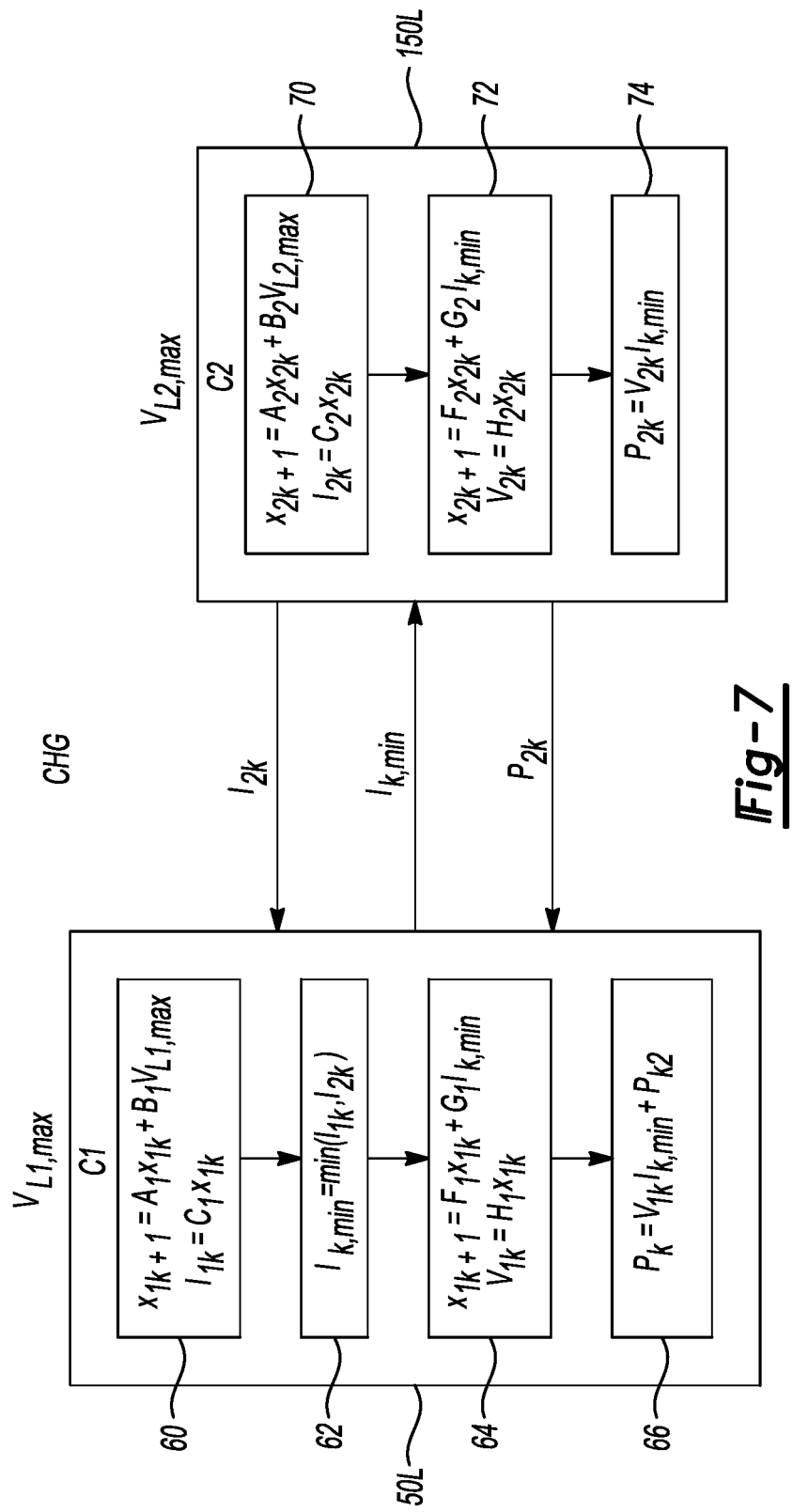
FIGS. 7 and 8 are schematic logic diagrams describing model-based information flow in the exemplary multi-controller topology of FIG. 4 during charging mode and discharging modes, respectively.

Step S106 entails predicting the pack voltages ($V_{1k}$ and $V_{2k}$) of the first and second battery packs 12A and 12B, respectively, using the selected current from step S104, $I_{k,min}$, along with a corresponding battery state space model, with an example of such a model in a charging case depicted in FIG. 7. The method 100 then proceeds to step S108.

At step S108, the controller 50 predicts the total power capability of the RESS 12 at time k, i.e., $P_k$, for an application-specific predetermined prediction horizon, e.g., 0.1 s, 1 s, 2 s, 10 s, 20 s, etc., which in turn enables forward-looking powertrain control decisions to be made by the controller 50 in real-time. As a general formulation:

$$P_k = (V_{1k} = V_{2k}) I_{k,min}.$$

Figure 8:
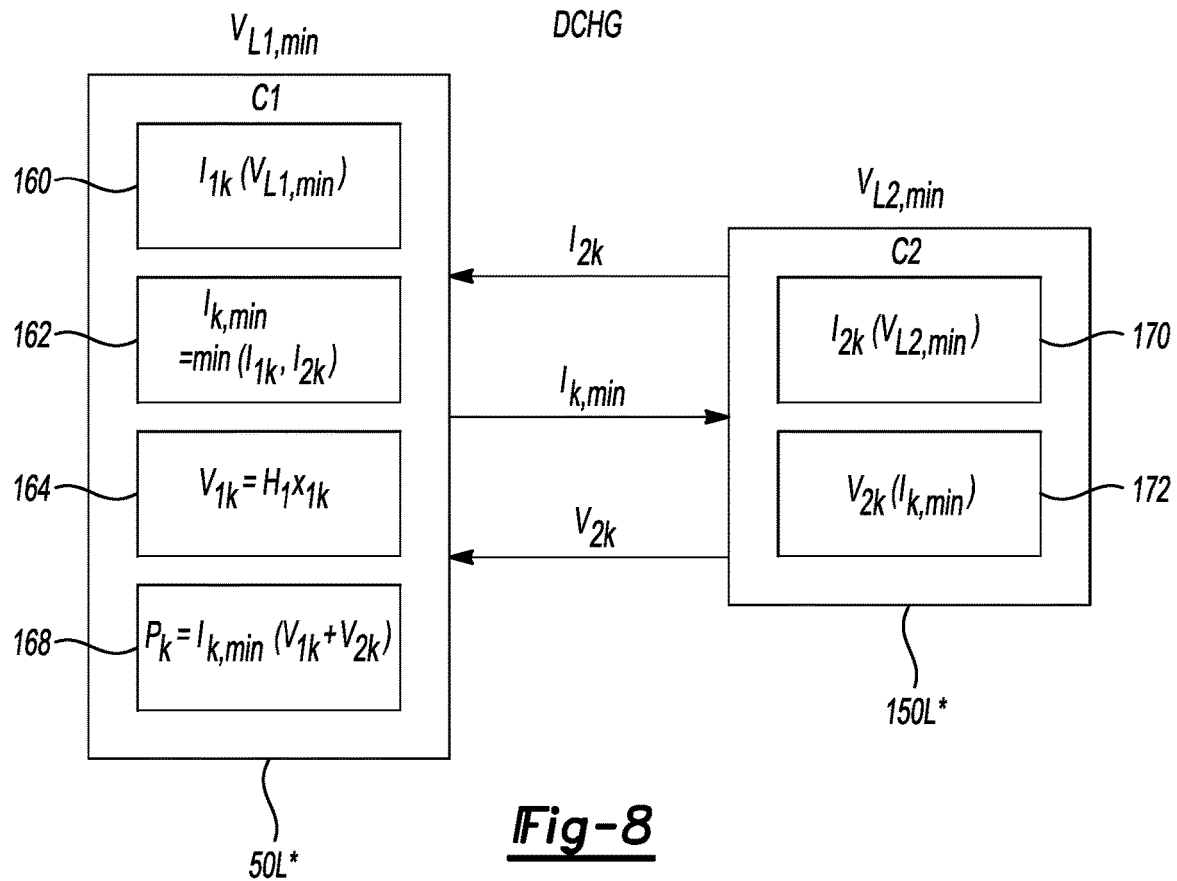

The flow chart of FIG. 6 may also be applied for a discharging mode of operation with modifications to the battery state models, e.g., as shown in FIG. 8.

BATTERY STATE MODEL—CHARGING CASE: FIG. 7 depicts implementation of the present method 100 in a charging mode (CHG) using the example multi-controller topology of FIG. 4. That is, the first controller 50 (C1), e.g., a first vehicle integration control module (VICM) in the representative motor vehicle 10 of FIG. 1, communicates via a CAN bus or other communications channels with the second controller 150 (C2), e.g., a second VICM, in a server-client arrangement. As noted above, the first and second controllers 50 and 150 receive or are programmed with the maximum voltage limit ($V_{L1,max}$) and ($V_{L2,max}$)) for the first and second battery packs 12A and 12B, respectively. Such calibration values may be provided by a manufacturer of the first and second battery packs 12A and 12B or otherwise made available to the first and second controllers 50 and 150.

The first and second controllers 50 and 150 are programmed with respective control logic 50L and 150L. The control logic 50L of first controller C1 includes logic blocks 60, 62, 64, and 66, while the control logic 150L of the second controller C2 includes logic blocks 70, 72, and 74. Collectively, the various logic blocks form a battery state space model, which may be variously embodied as an equivalent circuit model, an electrochemical physics-based model, or other suitably representative model of the battery packs 12A and 12B.

FIRST CONTROLLER 50 (C1): the logic block 60 of FIG. 7 may be used to determine the pack current of the first battery pack 12A at time point k, i.e., $I_{1,k}$. In an example formulation:

$$x_{1k+1} = A_1 x_{1k} + B_1 V_{L1,max}$$

$$I_{1,k} = C_1 x_{1k}$$

As will be appreciated, battery parameters in a battery state space model, here represented as battery parameters $A_1$, $B_1$, and $C_1$, as well as $F_1$, $G_1$, and $H_1$ described below, may be periodically updated using a Kalman filter and/or derived using parameters estimation techniques. The identity of the various battery parameters used in the respective battery state space models of first and second battery packs 12A and 12B may vary with the application. Illustrative example parameters may include Ohmic losses, circuit resistance and capacitance (collectively, a battery impedance), state of charge, open-circuit voltage, temperature, etc. The output of logic block 60, i.e., the pack current $I_{1k}$, feeds into logic block 62.

Using logic block 62, the first controller 50 receives a predicted pack current ($I_{2k}$) of the second battery pack 12B from the logic block 70 of the second controller 150, described below, and determines the minimum pack current $I_{k,min}$ at time point k, i.e.:

$$I_{k,min} = \min(I_{1k}, I_{2k})$$

The minimum pack current $I_{k,min}$ is then fed into logic block 64, and is also fed as an input to the second controller 150.

Logic block 64 is then used to estimate the pack voltage, $V_{1k}$, of the first battery pack 12A, doing so using the minimum pack current $I_{k,min}$ from logic block 62. For instance:

$$x_{1k+1} = F_1 x_{1k} + G_1 I_{k,min}$$

$$V_{1k} = H_1 x_{1k}$$

The first controller 50 then feeds the estimated pack voltage, $V_{1k}$ to logic block 66.

The first controller 50, using logic block 66, then estimates the total power capability $P_k$ of the RESS 12 at each time point k as $P_k=V_{1k}I_{k,min}+P_{2k}$, with the value $P_{2k}$ determined by the second controller 150 as set forth below. The process depicted in FIG. 7 is repeated for as many prediction time horizons as are required, e.g., k=0.1 s, 0.2 s, 1 s, 2 s, 10 s, 20 s, etc.

SECOND CONTROLLER (C2): still referring to FIG. 7, logic blocks 70, 72, and 74 of control logic 150L are analogous to logic blocks 60, 64, and 66 using different battery parameters $A_2$, $B_2$, $C_2$, $F_2$, $G_2$, and $H_2$, and allow the second controller 150 to estimate the pack current $I_{2k}$ of the second battery pack 12B. Logic block 70 may be programmed with a battery state space model of the second battery pack 12B for this purpose, such as:

$$x_{2k+1}=A_2x_{2k}+B_2V_{L2,max}$$

$$I_{2k}=C_2x_{2k}$$

The predicted pack current $I_{2k}$ is then fed into logic block 62 of the first controller 50 and used as set forth above.

Logic block 72 of the second controller 150 is analogous to logic block 64 of first controller 50, and ultimately estimates the power capability of the second battery pack 12B as follows:

$$x_{2k+1}=F_2x_{2k}+G_2I_{k,min}$$

$$V_{2k}=H_2x_{2k}$$

The value $V_{2k}$ may be derived using an inverse model, which estimates the voltage across the second battery pack 12B when connected. This value is fed into logic block 74.

Logic block 74 entails estimating peak power $P_{2k}$ of the second battery pack 12B, which is then fed into logic block 66 to calculate the estimated power $P_k$ for the RESS 12.

DISCHARGING CASE: FIG. 8 depicts control logic 50L* and 150L* for handling the discharging (DCHG) case, which are variations of the control logic 50L and 150L shown in FIG. 7. Using logic block 160, the first controller 50 uses the calibrated pack voltage limit, $V_{L1,min}$, for the first battery pack 12A to calculate the predicted pack current ($I_{1k}$) of the first battery pack 12A at time point k using a corresponding battery state space mode, i.e.:

$$I_{1k}(V_{L1,min})$$

This pack current ($I_{1k}$) is then fed into logic block 162.

Logic block 162 is then used to estimate the pack current of the RESS 12 as the minimum of the voltage-limited pack currents $I_{1,k}$ and $I_{2,k}$, with the latter value derived by the control logic 150L* from the second controller 150 as noted below. Formulaically, the process executed in logic block 162 may be expressed as:

$$I_{k,min}=\min(I_{1,k}, I_{2,k})$$

The minimum value is then fed into logic block 164.

At logic block 164 the first controller 50 uses the value $I_{k,min}$ to predict the value $V_{1,k}$ using the battery state model of the first battery pack 12A, as described above with reference to logic block 64 of FIG. 7. For instance:

$$x_{1k+1}=F_1x_{1k}+G_1I_{k,min}$$

$$V_{1k}=H_1x_{1k}$$

The first controller 50 then feeds the estimated pack voltage $V_{1k}$ of first battery pack 12A into logic block 168.

Thereafter, the first controller 50, using logic block 168, estimates the total power capability of the RESS 12 at time point k as $P_k=I_{k,min}(V_{1k}+V_{2k})$, with the value $V_{2k}$ determined by the second controller 150 at logic block 172 as set forth below. The process depicted in FIG. 7 is then repeated for as many prediction time horizons as are required, e.g., k=0.1 s, 0.2 s, 1 s, 2 s, 10 s, 20 s, etc.

SECOND CONTROLLER (C2): second controller 150 ultimately estimates the voltage capacity ($V_{2k}$) of the second battery pack 12B using control logic 150L*. Blocks 170 and 172 are analogous to blocks 70 and 72 of FIG. 7 but use the calibrated minimum voltage:

$$x_{2k+1}=A_2x_{2k}+B_2V_{L2,min}$$

$$I_{2k}=C_2x_{2k}$$

The value $I_{2k}$ for the second battery pack 12B is then fed into logic block 162 of the first controller 50 as noted above. Thus, for a given current, the control logic 150L* solves for voltage from the corresponding battery state model.

Logic block 172 receives the value $I_{k,min}$ from the first controller 50 and uses it to predict the pack voltage $V_{2k}$ for the second battery pack 12B, i.e.,:

$$x_{2k+1}=F_2x_{2k}+G_2I_{k,min}$$

$$V_{2k}=H_2x_{2k}$$

The pack voltage $V_{2k}$ is then fed as an input into logic block 168.

Figure 9:
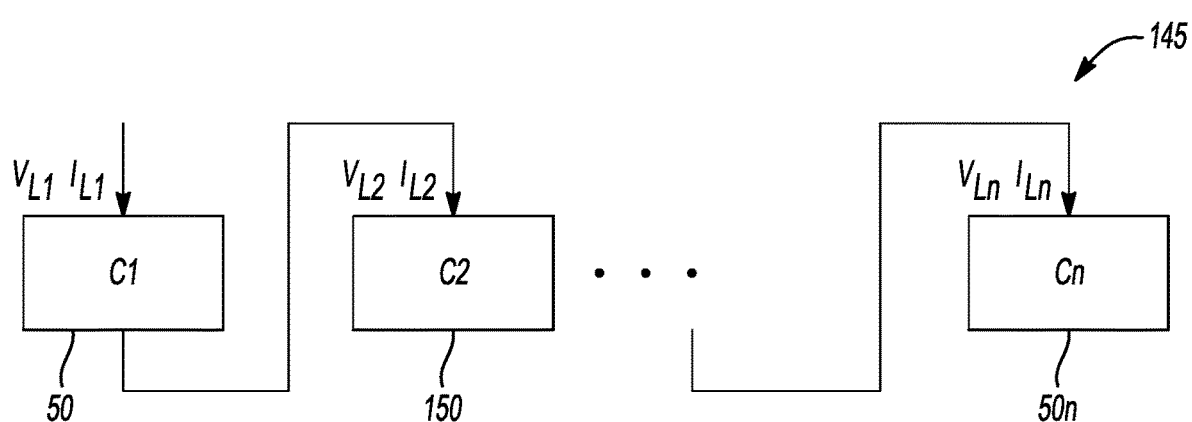
FIG. 9 is a schematic multi-controller setup according to the present disclosure.
Figure 10:
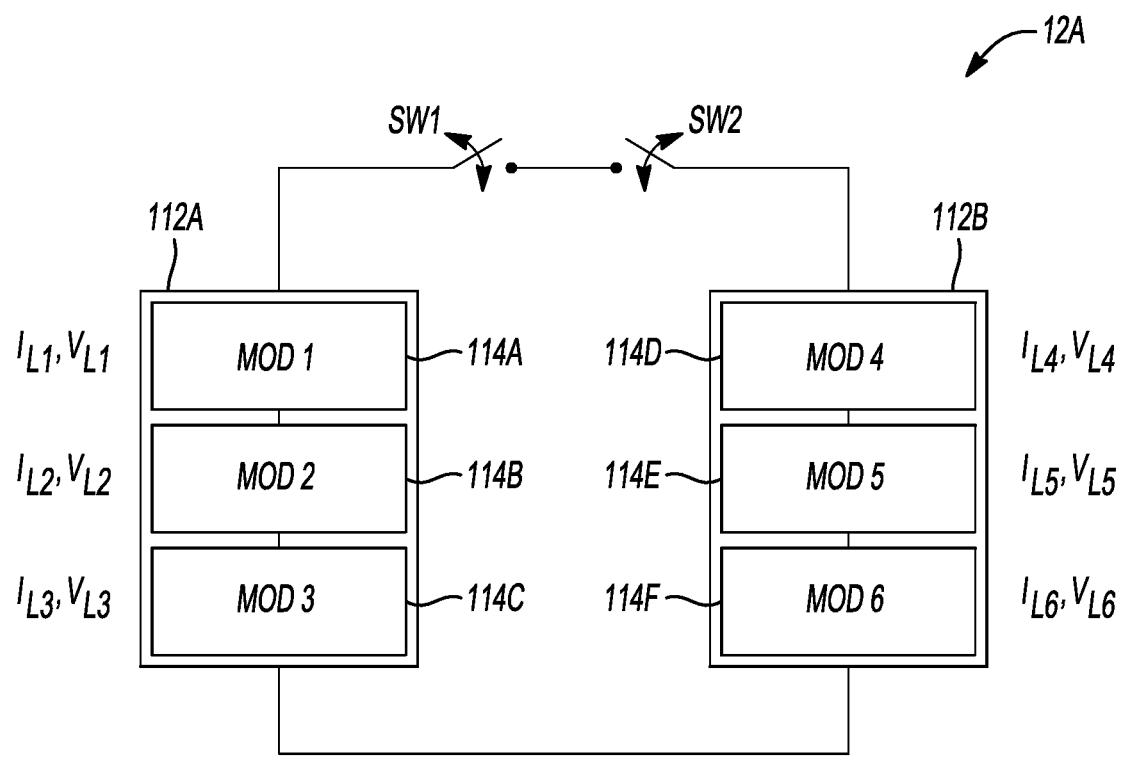
FIG. 10 is a schematic circuit diagram describing a parallel-connected battery pack arrangement in which each pack has serially-connected elements treated using the method set forth herein.

Referring to the example multi-controller topology 145 of FIG. 9, the above-described architecture and underlying methodology is well-suited to topologies using two serial-connected battery packs, e.g., the example first and second battery packs 12A and 12B. However, those of ordinary skill in the art in view of the forgoing disclosure will appreciate that more than two battery packs may be used. That is, a two-pack configuration can be generalized to n-multiple pack prediction where the n-multiple packs share one common controller, e.g., controller 50, or the first and second controller 50 and 150 are joined by at least one more controller, represented as controller 50n ($C_n$), to provide (n) total controllers, such as additional VICMs. Each controller has a pack-specific voltage and current as shown. As mentioned earlier in this disclosure, the multi-pack generalization can be replaced by series-connected individual cells, with each element, be it a pack, section, module, or cell, having different chemistries and/or ages, states of refurbishment, or other different characteristics.

In the following formulation, as with the above-noted formulations, notations in the form I(V) denote use of a given voltage to predict current using a given battery state model, while V(I) represents using a given current to predict a voltage using another battery state model. The two operating states of discharging and charging may be represented as follows:

Discharging Case:

$$I_{k,min}=\min(I_{1k}(V_{L1,min}), I_{2k}(V_{L2,min}), \ldots I_{nk}(V_{Ln,min}),$$
$$I_{1k,max}, \ldots I_{nk,max})$$

$$P_k=I_{k,min}(V_{1k}(I_{k,min})+V_{2k}(I_{k,min})+ \ldots V_{nk}(I_{k,min}))$$

Charging Case:

$$I_{k,min}=\min(I_{1k}(V_{L1,max}), I_{2k}(V_{L2,max}), \ldots I_{nk}(V_{Ln,max}),$$
$$I_{1k,max}, \ldots I_{nk,max})$$

$$P_k=I_{k,min}(V_{1k}(I_{k,min})+V_{2k}(I_{k,min})+ \ldots V_{nk}(I_{k,min}))$$

In the discharging case, a maximum current limit and a minimum voltage limit are specified for the particular battery element under consideration, i.e., pack, segment, module, cell, etc. Then, each element's current is predicted under is specified minimum voltage limit, $I_{1k}(V_{L1,min})$, $I_{2k}$, $(V_{L2,min})$, . . . $I_{nk}(V_{Ln,min})$, using each element's respective battery state model as described above. Since each element has to meet a maximum current limit as well, the current going through the RESS 12 should be limited to the minimum of all specified maximum current limits and calculated currents under minimum voltage limits for each element in the RESS 12. Once the current limit is predicted for a given element, this value is used to predict the power capability for each series-connected element, with the total power capability being the summation of the individual element powers.

FIG. 10 depicts an extension of the present S-connected power prediction teachings to a P-connected configuration. Here, a RESS 12A has first and second battery packs 112A and 112B are connected in parallel to a DC voltage bus (not shown) via corresponding switches Sw1 and Sw2. Each of the battery packs 112A and 112B have multiple S-connected battery elements, here depicted as modules 114A-114F, respectively labeled as MOD1, MOD2, MOD3, MOD4, MOD5, and MOD6. Three modules are shown in each battery pack 112A and 112B for simplicity, with the actual number of modules varying with the application. The various modules 114A-F may be identical, or they may have different chemistries or other characteristics such as different ages. Each module also has a corresponding calibrated current and voltage limit, e.g., $I_{L1}$, $V_{L1}$ for module 114A. In such a configuration, the S-connected prediction techniques disclosed herein may be used within each battery pack 112A and 112B, with the predicted power of each battery pack then added to determine the total power capability of the RESS 12.

As an example in a discharging case, using the specific voltage and current limits for each module, the controller 50 may estimate corresponding current for each module, then estimate the maximum current limits at time k for each pack 112A and 112B, i.e., $I_{pc,1,max}$ and $I_{pc,2,max}$:

$$I_{pc1max,k} = \min(I_{1k}(V_{L1,min}), I_{2k}(V_{L2,min}), I_{3k}(V_{L3,min}))$$

$$I_{pc2max,k} = \min(I_{4k}(V_{L4,min}), I_{5k}(V_{L5,min}), I_{6k}(V_{L6,min}))$$

The values may be used to calculate the terminal voltages of each battery pack 112A and 112B. Assuming each module has its own battery state model, a predicted terminal voltage is the sum of the predicted individual modular voltages, as will be appreciated. Alternatively, each battery pack may have a lumped battery model accounting for different chemistry in the modules, with the pack voltage predicted from such a lumped battery model. The parameters of the lumped battery pack model may be determined in some embodiments based on a Kalman filter using a combination of the parameters from the individual batter module models.

The controller 50 may then set the minimum voltage $(V_{min,k})$ of the P-connected RESS 12A as the maximum of the two terminal voltages, i.e., $V_{min,k} = \max(V_{T1,k}, V_{T2,k})$. Thereafter, the controller 50 may re-calculate each pack current $I_{pc1max,k}$ and $I_{pc2max,k}$ using the minimum common voltage limit, $V_{min,k}$. The controller 50 may thereafter predict the total system power over the forward-looking horizon, e.g., 0.2 s, 2 s, 10 s, 20 s, etc., as the sum of the powers:

$$P_k = I_{pc1max,k}(V_{min,k}) + I_{pc2max,k}(V_{min,k}).$$

As another example in a charging case, using the specific max voltage limits for each module as noted above, the controller 50 may estimate corresponding current for each module, and may then estimate the maximum current limits at time k for each pack 112A and 112B, i.e., $I_{pc,1,max}$ and $I_{pc,2,max}$:

$$I_{pc1max,k} = \min(I_{1k}(V_{L1,max}), I_{2k}(V_{L2,max}), I_{3k}(V_{L3,max}))$$

$$I_{pc2max,k} = \min(I_{4k}(V_{L4,max}), I_{5k}(V_{L5,max}), I_{6k}(V_{L6,max}))$$

The values may be used to calculate the terminal voltages of each battery pack 112A and 112B. The controller 50 may then set the maximum voltage $(V_{max,k})$ of the P-connected RESS 12A as the minimum of the two terminal voltages, i.e., $V_{max,k} = \min(V_{T1,k}, V_{T2,k})$. Thereafter, the controller 50 may re-calculate each pack current $I_{pc1max,k}$ and $I_{pc2max,k}$ using the common voltage limit, $V_{max,k}$. The controller 50 may thereafter predict the total system power over the forward-looking horizon, e.g., 0.2 s, 2 s, 10 s, 20 s, etc., as the sum of the powers:

$$P_k = I_{pc1max,k}(V_{max,k}) + I_{pc2max,k}(V_{max,k})$$

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A method for managing powerflow of a multi-pack rechargeable energy storage system (RESS) of a powertrain system having a power inverter module (PIM) and a rotary electric machine connected to the PIM, wherein the rotary electric machine includes an output member connected to a load, the RESS having series-connected (S-connected) first and second battery packs with different characteristics, wherein each of the first battery pack and the second battery pack have a corresponding maximum voltage or current limit, the method comprising:
   predicting a corresponding first and second pack current for the first battery pack and the second battery pack, respectively, via a controller of the powertrain system using the corresponding maximum voltage limit;
   receiving, via the controller, a requested operating mode of the RESS;
   selecting the first or second pack current as a selected current based on the requested operating mode;
   predicting a pack voltage across each of the first battery pack and the second battery pack using the selected current and corresponding battery state models;
   predicting a total power capability of the RESS over a predetermined prediction horizon using the selected current to thereby generate a plurality of predicted power capability values; and
   controlling the requested operating mode over the predetermined prediction horizon, via the controller, using the plurality of predicted power capability values.

2. The method of claim 1, wherein selecting the first or second pack current includes selecting a minimum of the first or second pack current when the requested operating mode is a charging mode.

3. The method of claim 1, wherein selecting the first or second pack current includes selecting a minimum of the first or second pack current when the requested operating mode is a discharging mode.

4. The method of claim 1, further comprising:
receiving a fast-charging voltage and current from an offboard fast-charging station, via the RESS, during a fast-charging operation;
wherein the requested operating mode is the charging mode, and controlling the requested operating mode occurs during the charging mode by controlling the fast-charging operation via the controller.

5. The method of claim 1, wherein the requested operating mode is the discharging mode, and wherein controlling the requested operating mode includes energizing a rotary electric machine via the RESS and the PIM.

6. The method of claim 1, wherein the predetermined prediction horizon includes at least five future time points relative to a present time point (k=0), including k =0.1s, 1s, 2s, 10s, and 20s.

7. The method of claim 1, wherein the controller includes hierarchically-arranged first and second controllers, predicting the second pack current is accomplished via the second controller using a second one of the battery state models and communicated to the first controller, predicting the first pack current is accomplished via the first controller using a first of the battery state models, and predicting the total power capability and controlling the requested operating mode is accomplished via the first controller.

8. The method of claim 7, wherein the first and second controllers are first and second vehicle integration control modules (VICMs) of a motor vehicle.

9. The method of claim 7, wherein each of the battery state space models include a plurality of battery parameters for the first and second battery packs, respectively, including a state of charge, an open-circuit voltage, and a battery impedance.

10. The method of claim 1, wherein the RESS includes a third battery pack that is serially-connected to the first and second battery packs, and wherein the first, second, and third battery packs each have a corresponding controller and a corresponding battery state space model.

11. A powertrain system comprising:
a rechargeable energy storage system (RESS) having:
series-connected first and second battery elements each connected to a DC voltage bus, and each having corresponding maximum voltage limits; and
first and second sensors connected to the respective first and second battery elements, each of the first and second sensors being operable for measuring a corresponding current and voltage of the first battery element and the second battery element;
a power inverter module (PIM) connected to the RESS;
a rotary electric machine connected to the PIM and having an output member coupled to a load; and
a controller operable for managing powerflow of the RESS, wherein the controller is programmed with a corresponding maximum current limit of the first and second battery elements, and is configured to:
predict a corresponding first and second current of the first battery element and the second battery element, respectively, using the maximum voltage limits;
receive a requested operating mode of the RESS;
select the first or second current as a selected current based on the requested operating mode, including selecting a minimum of the first or second current;
predict a voltage across each of the first battery element and the second battery element using the selected current and corresponding battery state space models;
predict a total power capability of the RESS over a predetermined prediction horizon using the predicted voltage to thereby generate a plurality of predicted power capability values; and
control the requested operating mode over the predetermined prediction horizon using the plurality of predicted power capability values.

12. The powertrain system of claim 11, wherein the RESS is configured to receive a fast-charging voltage and current from an offboard fast-charging station during a fast-charging operation, the requested operating mode is the charging mode, and the controller is configured to control the fast-charging operation during the charging mode.

13. The powertrain system of claim 11, wherein the requested operating mode is the discharging mode, and wherein the controller is configured to control the requested operating mode by energizing the rotary electric machine via the RESS and the PIM.

14. The powertrain system of claim 11, wherein the predetermined prediction horizon includes at least five future time points.

15. The powertrain system of claim 14, wherein relative to a current time point (k)=0 seconds (s), the at least five future time points include k=0.1s, 1 s, 2s, 10s, and 20s.

16. The powertrain system of claim 11, wherein the controller includes hierarchically-arranged first and second controllers, the second controller is configured to predict the second current using a second one of the battery state space models and communicate the second current to the first controller, and the first controller is configured to predict the first current using a first one of the battery state space models, predict the total power capability, and control the requested operating mode.

17. The powertrain system of claim 16, wherein the first and second controllers are respective first and second vehicle integration control modules (VICMs) of a motor vehicle, and wherein the load is a set of road wheels of the motor vehicle.

18. The powertrain system of claim 11, wherein each of the battery state models include a plurality of battery parameters for the first and second battery elements, respectively, including a state of charge, an open-circuit voltage, and a battery impedance.

19. The powertrain system of claim 11, wherein the RESS includes a third battery element connected in series with the first and second battery element.

20. The powertrain system of claim 11, wherein the RESS is a multi-pack RESS having parallel-connected first and second battery packs, and wherein the first and second battery elements are constituent parts of the respective first and second battery packs.

* * * * *